United States Patent [19]

Wise et al.

[11] 4,420,650
[45] Dec. 13, 1983

[54] WEDGED CHANNEL VERTICAL JUNCTION SILICON SOLAR CELL

[75] Inventors: Joseph F. Wise, Dayton; James F. Holt, Medway, both of Ohio

[73] Assignee: The United States of America as represented by the Secretary of the Air Force, Washington, D.C.

[21] Appl. No.: 356,573

[22] Filed: Mar. 9, 1982

[51] Int. Cl.³ .................................... H01L 31/06
[52] U.S. Cl. ............................... 136/255; 156/662; 357/20; 357/30
[58] Field of Search ............... 136/255; 357/20, 30; 156/662

[56] References Cited

U.S. PATENT DOCUMENTS

| | | | |
|---|---|---|---|
| 3,690,953 | 9/1972 | Wise | 136/255 |
| 3,985,579 | 10/1976 | Rahilly | 136/255 |
| 4,137,123 | 1/1979 | Bailey et al. | 156/647 |
| 4,147,564 | 4/1979 | Magee et al. | 148/1.5 |
| 4,160,045 | 7/1979 | Longshore | 427/38 |
| 4,227,942 | 10/1980 | Hall | 136/255 |
| 4,252,865 | 2/1981 | Gilbert et al. | 428/611 |
| 4,352,948 | 10/1982 | Kaplow et al. | 136/249 |

OTHER PUBLICATIONS

J. Lindmayer et al., "New Developments In Vertical-Junction Solar Cells", *Conf. Record, 12th IEEE Photovoltaic Specialists Conf.* (1976), pp. 30–32.

*Primary Examiner*—Aaron Weisstuch
*Attorney, Agent, or Firm*—Donald J. Singer; Bobby D. Scearce

[57] ABSTRACT

An improved vertical junction solar cell is provided which comprises a thin single-crystalline silicon chip having on one surface thereof a plurality of short channels etched therein in a desired array, the length l of the channels being related to the depth d of the channels by a relationship approximating $d = l/2\sqrt{3}$. The resulting structure provides improved light utilization at end-of-life condition, conversion efficiency, mechanical strength and radiation resistance.

3 Claims, 5 Drawing Figures

WEDGED CHANNEL VERTICAL JUNCTION SILICON SOLAR CELL

RIGHTS OF THE GOVERNMENT

The invention described herein may be manufactured and used by or for the Government of the United States for all governmental purposes without the payment of any royalty.

BACKGROUND OF THE INVENTION

This invention relates generally to the field of solar cells, and more particularly to improvements in vertical junction solar cells.

The basic structure and operation of solar cells is well known, and the utilization of silicon solar cells for the generation of electricity for remote marine, terrestrial, and satellite applications is well documented. The development of the vertical junction solar cell answered the need for a radiation resistant cell having improved electrical conversion efficiency for operation in an ionizing radiation environment to which the cell may be subjected in extra-terrestrial applications. The state of the art relating to vertical junction solar cells may be exemplified by solar cell configurations disclosed by or referenced in U.S. Pat. No. 3,690,953 to Wise, entitled "Vertical Junction Hardened Solar Cell", and U.S. Pat. No. 3,985,579 to Rahilly, entitled "Rib and Channel Vertical Multijunction Solar Cell".

Vertical junction solar cells finding substantial prior use have structural fragility which has made them susceptible to failure when subjected to thermal cycling, or when subjected to mechanical stresses within a power system. Since desirable radiation resistance and good electrical conversion efficiency of the cell are related in part to channel depth, it is desirable to optimize channel depth, especially if structural integrity can be maintained. In existing vertical junction solar cells, optimum radiation resistance is substantially achieved for channel depths of about $75\mu$ ($75 \times 10^{-4}$ cm). However, the ribs between channels of that depth in existing configurations are undesirably fragile, and, therefore, channel depth in fabricated cells has, for practical purposes, been limited to considerably less than that consistent with optimum radiation resistance and cell efficiency. Existing cell structures also have excessively large channel length-to-depth ratios and are characterized by limited control on the channel depth during fabrication, which precludes effective quality control during fabrication.

The present invention provides a novel vertical junction solar cell structure comprising a silicon chip having in one surface a plurality of short, wedge-shaped channels closely spaced in an array and separated by thin vertical ribs which are configured to substantially eliminate any rib fracture problems. The junction is diffused over the rib surfaces and chip surfaces between the ribs. The cell is fabricated from a chip having the surface parallel to the (110) crystallographic planes, and the channels are aligned along the (111) planes following conventional technique. Unconventional control of the length l of the channels forming the vertical junctions, however, allows substantial control of channel depth d, approximately according to the relationship $d = l/2\sqrt{3}$. Vertical junction cells according to the present invention are thus characterized by deeper channel construction which results in substantially increased light utilization at end-of-life condition, and improved fabrication process control, as well as improved radiation resistance, conversion efficiency and mechanical integrity.

It is therefore an object of this invention to provide an improved efficiency silicon solar cell.

It is a further object of this invention to provide a vertical junction solar cell having improved mechanical strength and light-absorbing characteristics.

These and other objects of the present invention will become apparent as the detailed description of representative embodiments thereof proceeds.

SUMMARY OF THE INVENTION

In accordance with the foregoing principles and objects of the invention, an improved vertical junction solar cell is provided which comprises a thin single-crystalline silicon chip having on one surface thereof a plurality of short channels etched therein in a desired array, the length l of the channels being related to the depth d of the channels by a relationship approximating $d = l/2\sqrt{3}$. The resulting structure provides improved light utilization at end-of-life condition, conversion efficiency, mechanical strength and radiation resistance.

DESCRIPTION OF THE DRAWINGS

The present invention will be more clearly understood from the following detailed description of representative embodiments thereof read in conjunction with the accompanying drawings wherein.

DETAILED DESCRIPTION

Figure 1A:
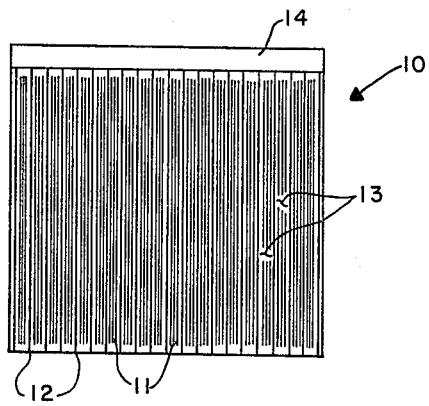
FIGS. 1a and 1b present plan views of conventional vertical junction solar cells.
Figure 1B:
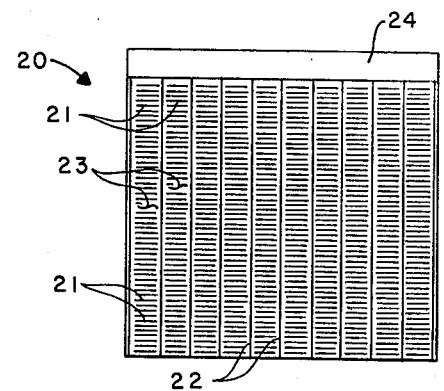

Referring now to the accompanying drawings, FIGS. 1a and 1b are plan views of typical prior art configurations of silicon vertical junction solar cells. Each configuration shown in FIGS. 1a and 1b comprises a semiconductor substrate such as a thin silicon chip, typically about 2 centimeters wide, and has a plurality of etched channels in a surface of the chip which contain the vertical photovoltaic junction. The FIG. 1a configuration for cell 10 comprises a plurality of etched channels 11 extending substantially the entire width of cell 10, as illustrated, with a plurality of metallic electrical contact strips 12 separating channels 11 into a plurality of long, narrow active areas 13, each containing a plurality of channels 11. Header strip 14 joins the contact strips 12 to provide an electrical contact for cell 10. The configuration for cell 20, as depicted in FIG. 1b, comprises a plurality of etched channels 21 aligned parallel to header strip 24 in sets defining active areas 23 separated by electrical contact strips 22 which join header 24. Each cell 10 and 20 has another electrical contact (not shown in the figures) formed on the bottom cell surface opposite that shown in the FIGS., in the form of a metallized coating. The top surface area, containing the etched channels of each cell 10 and 20, is diffused in conventional fashion with appropriate dopant to form the P/N junction.

Fabrication of cells 10 and 20 may follow a conventional process sequence which, for silicon cells, may be summarized as follows:

1. provide a chip of P-type silicon having the (110) crystallographic planes parallel to the surfaces of the chip;

2. form an oxidized coating on the surfaces of the chip;

3. coat a surface of the chip with photoresist;

4. cover the surface with a mask defining the desired channel pattern and align the channel pattern parallel to the (111) crystallographic planes, expose, and remove the photoresist and oxide in the channel pattern;

5. etch the channels to the desired depth using an orientation dependent etchant such as potassium hydroxide solution (nominally 30%);

6. remove residual photoresist material and oxide coating on the chip surfaces;

7. form an N-type junction in the entire etched surface area by diffusion of a Group V dopant material, such as phosphorous, arsenic, or the like, into the surface of the chip to the desired depth;

8. apply metallic electrical contacts in the desired configuration on the top and bottom surfaces of the chip; and 9. apply an antireflective coating of such as an oxide of silicon or tantalum or multilayer coatings of other suitable materials conventionally used therefor.

Prior art cells 10 and 20 as depicted in FIGS 1a and 1b, respectively, typically include channels of considerable length, and an especially high length-to-depth ratio which results in undesirable fragility of the cell structure, and particularly of the thin ribs between channels, for configurations having desirable channel depths. For example, channels 11 of cell 10 are typically greater than 1 cm (10,000μ) in length, and channels 21 of cell 20 are typically 1,000μ or more in length. In both cells 10 and 20 the channel widths are nominally about 10μ and channel depths are from about 25μ to about 50μ; rib widths (between adjacent channels) approximate 15μ. Further, the conventional configurations do not have well controlled depth for the channels, resulting in less than optimum conversion efficiency, particularly in a radiation environment.

Figure 2:
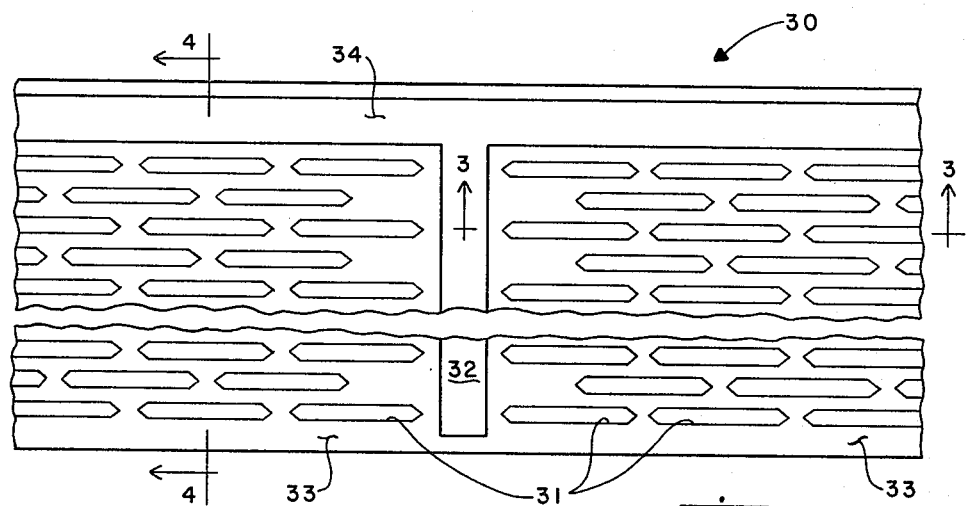
FIG. 2 is a fragmentary plan view of a vertical junction solar cell of the present invention.

Referring now to FIG. 2, shown therein is a partial plan view, substantially enlarged, of a portion of the novel vertical junction solar cell of the present invention. The solar cell 30 of this invention may comprise a semiconductor substrate of such as a thin, substantially flat silicon chip approximately 2 cm × 2 cm by about 0.02 cm thick. It is understood, however, that the novel structure herein may be applied to solar cells of other dimensions, as will appear from the following discussion.

Solar cell 30 of the present invention may comprise a plurality of short, wedge or vee shaped channels arranged on and etched into the surface of cell 30 substantially as shown in FIG. 2. The channels 31 may preferably be arranged on the surface of the cell 30 to define substantially distinct active surface areas 33, each containing a large number of channels 31 and separated by a plurality of electrical contact strips or fingers 32. Electrical header strip 34 joins the electrical fingers 32 in conventional fashion to provide an electrical contact for cell 30. Within each active area 33, each row of channels 31 may be offset with respect to its adjacent rows in order to improve the overall mechanical strength of cell 30 structure and to provide support for vertical rib sections 35 defined between adjacent channels 31. Optimally, each row of channels will be offset by about one-half a channel length, substantially as shown in FIG. 2.

Fabrication of the novel solar cell 30 of the present invention may be performed using the KOH etching process similar to that described above. In the process of etching the surface of cell 30, the silicon chip selected for use has its surfaces parallel to the (110) crystallographic planes, and channels 31 are etched parallel to the (111) planes, according to conventional technique. It is to be noted, however, that in the fabrication of the solar cell 30 of the present invention, the length l of channels is controlled consistent with the desired depth d (see FIG. 3). It is noted that the etching process proceeds parallel to the (111) crystallographic planes at a rate approximately 50 times that at which it proceeds perpendicular to those planes. Therefore, the KOH—H$_2$O solution acts as an orientation dependent etch and selectively etches the silicon along a (111) crystallographic plane; the etching process will essentially stop when the solution encounters a set of (111) planes. Thus, by careful selection and control of the length l of channels 31, uniform and accurate values for the depth d may be maintained, and channels 31 will assume a shape having the wedge or vee shaped cross-section illustrated in FIG. 3. Further the relative orientations of the (110) and (111) crystallographic planes in silicon will result in a relationship between l and d approximating $$d \cong l/2\sqrt{3}$$

and a desired value for d may be maintained by accurately controlling l.

In the fabrication of a solar cell 30 of the present invention, the desired depth and associated length for channels 31 may be selected depending upon the oveall thickness of the silicon chip of which solar cell 30 is comprised, and, along with the value of the spacing between channels, may be varied in order to optimize mechanical strength, electrical conversion efficiency, and particulate radiation resistance. For example, a solar cell 30 fabricated in demonstration of the invention herein has a channel 31 depth of about 50μ, length of about 170μ, and a width of about 10μ; rib 35 was about 17μ thick. Normally, a fabricated cell would desirably have a channel depth of 25μ to 75μ, which, according to the relationship for l given above, would include a channel length of approximately 85μ to 260μ.

Figure 3:
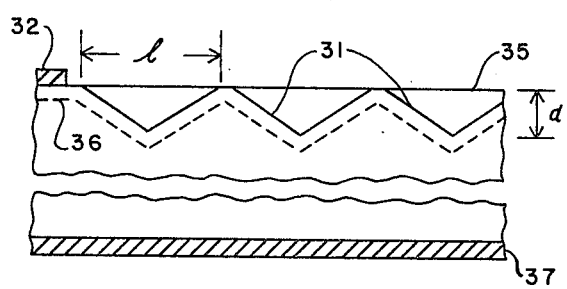
FIG. 3 is a sectional view of a portion of the solar cell depicted in FIG. 2 taken along lines 3—3.
Figure 4:
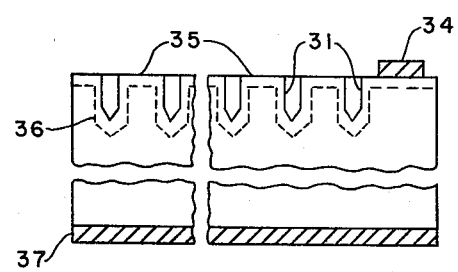
FIG. 4 is a sectional view of a portion of the solar cell depicted in FIG. 2 taken along lines 4—4.

The structure of the novel solar cell of the present invention may be completed by diffusing into the etched surface a Group V dopant material to a depth of about 0.2 microns, as depicted by the dotted line labeled 36 of FIG. 3 and FIG. 4. An electrical header 34 and contact fingers 32 of conventional composition such as aluminum, silver, Ti-Pd-Ag alloy, or the like, may then be applied conventionally and a metallized coating 37 may be applied to the back surface of cell 30 to complete the construction. Header 34, fingers 32, and coating 37 may be applied to any desired thickness, although a thickness of from about 5 to 10 microns is normally acceptable.

The present invention, as hereinabove described, therefore provides an improved vertical junction solar cell having significantly improved mechanical strength and enhanced light-trapping characteristics as compared to configurations existing in the prior art. It is understood that numerous modifications to the invention as hereinabove described may be made with regard to semiconductor substrate material selection, the number and dimensions of channels comprising the active area of the solar cell and the technique for forming them, and the selection of material for doping the N-type junction, as might occur to one with skill in the field of this invention. Therefore, all embodiments contemplated hereunder have not been described in complete detail. Other embodiments may be developed without departing from the spirit of this invention or from the scope of the appended claims.

We claim:

1. A vertical junction solar cell comprising:
   a. a semiconductor substrate of predetermined thickness having substantially parallel upper and lower surfaces:
   b. a plurality of spaced, electrically conducting strips on said upper surface and separating said upper surface into a plurality of distinct active areas, and an electrical header strip joining said conducting strips to provide a first electrical contact for said cell;
   c. a second electrical contact on said lower surface; and
   d. a multiplicity of channels formed in each of said active areas, said channels having a depth substantially less than said substrate thickness and being arranged along the lengths thereof in substantially parallel rows, each row comprising a plurality of said channels defined by a plurality of thin vertical ribs of said substrate between adjacent rows which include the vertical junctions of said cell, and by a plurality of regions of said substrate between proximate ends of said channels in each row, each of said channels in each row having adjacent thereto and near its midpoint at least one said region of an adjacent row, whereby each of said channels in each row is offset with respect to corresponding channels in the adjacent rows.

2. The solar cell as recited in claim 1 wherein said substrate comprises a silicon crystal and said upper and lower surfaces are parallel to a (110) crystallographic plane of said crystal and said channel lengths are formed in said substrate parallel to a (111) plane of said crystal.

3. In a method for fabricating a silicon solar cell including the steps of selecting a silicon crystal substrate of predetermined thickness and having opposed front and rear surfaces parallel to a (110) crystallographic orientation, and chemically etching channels to predetermined depth less than said thickness into a surface of said substrate and parallel to the (111) crystallographic planes of said silicon, the improvement comprising selecting a length for said channels of about $2\sqrt{3}$ times said predetermined depth.

* * * * *